(12) United States Patent
Shaked et al.

(10) Patent No.: US 11,546,085 B2
(45) Date of Patent: Jan. 3, 2023

(54) TECHNIQUES FOR CONFIGURING DEMODULATOR SEARCH SPACE IN WIRELESS COMMUNICATIONS

(71) Applicant: QUALCOMM Incorporated, San Diego, CA (US)

(72) Inventors: Shlomit Shaked, Beer sheva (IL); Shay Landis, Hod Hasharon (IL); Jacob Pick, Beit Zait (IL)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/217,701

(22) Filed: Mar. 30, 2021

(65) Prior Publication Data
US 2022/0321257 A1 Oct. 6, 2022

(51) Int. Cl.
*H04B 7/0413* (2017.01)
*H04L 1/00* (2006.01)
(Continued)

(52) U.S. Cl.
CPC .......... *H04L 1/0054* (2013.01); *H04L 5/0048* (2013.01); *H04L 27/38* (2013.01); *H04W 72/042* (2013.01); *H04B 7/0413* (2013.01)

(58) Field of Classification Search
CPC ............... H04W 72/042; H04W 72/14; H04W 72/0453; H04W 52/146; H04W 52/367; H04W 72/0413; H04W 72/1289; H04W 4/40; H04W 72/04; H04W 72/0446; H04W 72/1284; H04W 76/27; H03M 13/13; H03M 13/09; H03M 13/116; H03M 13/2906; H03M 13/255; H03M 13/618; H03M 13/6362; H03M 13/112; H03M 13/1131; H03M 13/1154; H03M 13/1171; H04L 5/0053; H04L 1/0057; H04L 1/0061; H04L 1/1812; H04L 5/0048; H04L 5/0051; H04L 1/0041; H04L 5/0044; H04L 5/0094; H04L 5/001; H04L 1/08; H04L 1/1896
(Continued)

(56) References Cited

U.S. PATENT DOCUMENTS

2013/0294547 A1* 11/2013 Lane ..................... H04L 1/0036
375/340
2017/0223687 A1 8/2017 Kuchibhotla et al.
(Continued)

OTHER PUBLICATIONS

International Search Report and Written Opinion—PCT/US2022/070874—ISA/EPO—dated May 31, 2022.

*Primary Examiner* — Eva Y Puente
(74) *Attorney, Agent, or Firm* — ArentFox Schiff LLP

(57) ABSTRACT

Aspects described herein relate to configuring a search space size for a demodulator to use in generating log likelihood ratios (LLRs) in demodulating received signals. In an aspect, an indication of a search space size for a demodulator to use in generating LLRs can be received from a base station, and a demodulation of one or more signals received in wireless communication can be performed by a node using the demodulator and based on the search space size. In another aspect, a search space size for the demodulator of the node to use in generating log likelihood ratios (LLRs) can be determined based on one or more signals transmitted by the node, and an indication of a search space size can be transmitted to the node.

30 Claims, 7 Drawing Sheets

(51) Int. Cl.
*H04L 27/38* (2006.01)
*H04W 72/04* (2009.01)
*H04L 5/00* (2006.01)

(58) Field of Classification Search
USPC .......................................................... 375/341
See application file for complete search history.

(56) References Cited

U.S. PATENT DOCUMENTS

2019/0098620 A1\* 3/2019 Guo ...................... H04L 5/0057
2020/0022144 A1   1/2020 Papasakellariou
2021/0243812 A1\* 8/2021 Agiwal ................. H04L 5/0048
2021/0250904 A1\* 8/2021 Liu ....................... H04L 1/0075
2021/0289517 A1\* 9/2021 Li ....................... H04W 72/1242

\* cited by examiner

TECHNIQUES FOR CONFIGURING DEMODULATOR SEARCH SPACE IN WIRELESS COMMUNICATIONS

BACKGROUND

Aspects of the present disclosure relate generally to wireless communication systems, and more particularly, to demodulator search spaces in wireless communications.

Wireless communication systems are widely deployed to provide various types of communication content such as voice, video, packet data, messaging, broadcast, and so on. These systems may be multiple-access systems capable of supporting communication with multiple users by sharing the available system resources (e.g., time, frequency, and power). Examples of such multiple-access systems include code-division multiple access (CDMA) systems, time-division multiple access (TDMA) systems, frequency-division multiple access (FDMA) systems, and orthogonal frequency-division multiple access (OFDMA) systems, and single-carrier frequency division multiple access (SC-FDMA) systems.

These multiple access technologies have been adopted in various telecommunication standards to provide a common protocol that enables different wireless devices to communicate on a municipal, national, regional, and even global level. For example, a fifth generation (5G) wireless communications technology (which can be referred to as 5G new radio (5G NR)) is envisaged to expand and support diverse usage scenarios and applications with respect to current mobile network generations. In an aspect, 5G communications technology can include: enhanced mobile broadband addressing human-centric use cases for access to multimedia content, services and data; ultra-reliable-low latency communications (URLLC) with certain specifications for latency and reliability; and massive machine type communications, which can allow a very large number of connected devices and transmission of a relatively low volume of non-delay-sensitive information.

In some wireless communication technologies, such as 5G NR, devices, including user equipment (UE), can use advanced receivers having specific demodulators that consider a defined search space over a constellation for generating log likelihood ratios (LLRs) for demodulating received signals. One example of such a demodulator can include a per-stream recursive demapping (PSRD) demodulator.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

According to an aspect, an apparatus for wireless communication is provided that includes a transceiver, a memory configured to store instructions, a demodulator communicatively coupled with the memory and the transceiver that demodulates signals received via the transceiver, and one or more processors communicatively coupled with the demodulator, the memory, and the transceiver. The one or more processors are configured to receive, from a base station, an indication of a search space size for the demodulator to use in generating log likelihood ratios (LLRs), and perform, using the demodulator and the search space size, a demodulation of one or more signals received in wireless communication.

In another aspect, an apparatus for wireless communication is provided that includes a transceiver, a memory configured to store instructions, and one or more processors communicatively coupled with the memory and the transceiver. The one or more processors are configured to receive, from a user equipment (UE), one or more uplink signals, determine, based on the one or more uplink signals, a search space size for a demodulator of the UE to use in generating LLRs for one or more received signals, and transmit, to the UE, an indication of a search space size.

In another aspect, a method for wireless communication is provided that includes receiving, from a base station, an indication of a search space size for a demodulator to use in generating LLRs, and performing, using the demodulator and the search space size, a demodulation of one or more signals received in wireless communication.

In another aspect, a method for wireless communication is provided that includes receiving, from a UE, one or more uplink signals, determining, based on the one or more uplink signals, a search space size for a demodulator of the UE to use in generating LLRs for one or more received signals, and transmitting, to the UE, an indication of a search space size.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

Figure 1:
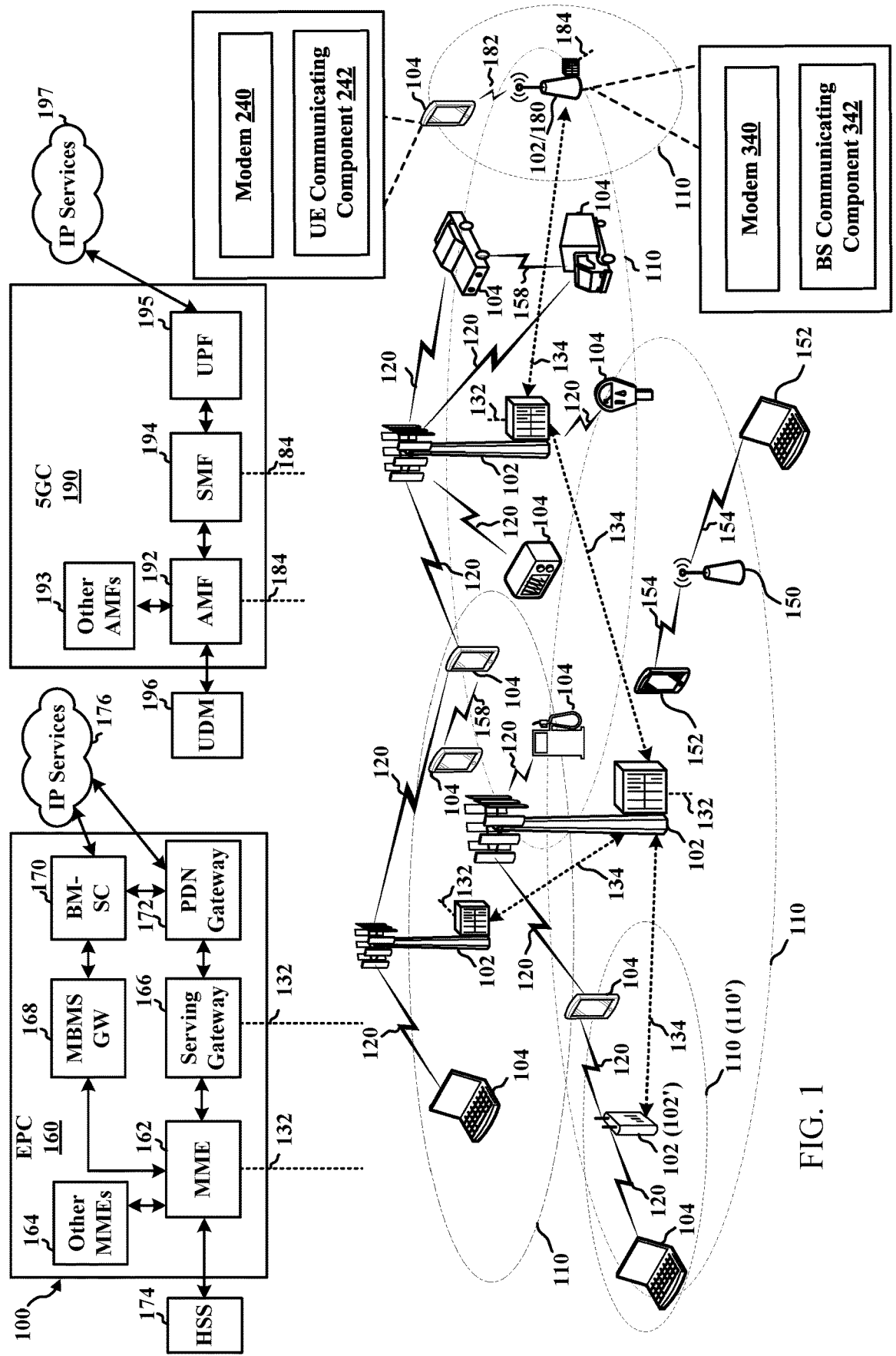
FIG. 1 illustrates an example of a wireless communication system, in accordance with various aspects of the present disclosure.

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

The described features generally relate to configuring demodulator search space in wireless communications. For example, in wireless communication technologies such as fifth generation (5G) new radio (NR), devices can use advanced receivers having certain types of demodulators that use search spaces for generating log likelihood ratios (LLRs) for demodulating received signals. One example of such a demodulator can include a per-stream recursive demapping (PSRD) demodulator. A PSRD demodulator can determine or utilize a search space for searching over a constellation for generating the LLRs, as described further herein. Typically, the device that has the demodulator can determine a size of the search space, which is also referred to herein as the search space size, based on measured metrics, which may include channel quality or reference signal received power or quality metrics. Aspects described herein relate to performing search space size selection at a different node, such as a node transmitting signals to the receiving device that has the demodulator.

In 5G NR, for example, where a user equipment (UE) includes the demodulator and receives signals, a base station or other node with more processing resources than the UE may configure the search space size for the UE demodulator. For example, the base station can determine the search space size based on metrics received from the UE, which may include a latest received sounding reference signal (SRS), a determined delay from receiving the latest SRS, channel state information (CSI) reports from the UE, or other metrics reported by the UE. The base station can use this information to determine an expected search space size to be used by the UE demodulator and can signal the search space size, or one or more parameters for determining the search space size, to the UE. The UE can accordingly determine the search space size and use the search space size for the demodulator in generating LLRs for demodulating received signals (e.g., signals received from the same base station or other nodes).

Using a different node, such as a base station or other node with higher processing power or more readily available processing resources than a UE, to configure the search space size, may allow for more powerful resource intensive search space size determination. For example, the different node can use artificial intelligence (AI)-based search space size determination based on the metrics provided by the UE. Using different or more intensive search space size determination at the different node, in this regard, can allow for more accurate or intuitive search space size determination for the UE in its specific radio environment. This can, in turn, improve demodulation results and overall communication performance and user experience at the UE. For example, using the different node to configure the search space size can allow for higher spectral efficiency where a base station (e.g., gNB) performs the calculations and adjusts the demodulator search space size according to the UE reports, as well as power saving at the UE, as the demodulator search space size calculations are done in the base station (e.g., gNB side), and there is no additional calculations in the UE side.

The described features will be presented in more detail below with reference to FIGS. 1-7.

As used in this application, the terms "component," "module," "system" and the like are intended to include a computer-related entity, such as but not limited to hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component can be localized on one computer and/or distributed between two or more computers. In addition, these components can execute from various computer readable media having various data structures stored thereon. The components can communicate by way of local and/or remote processes such as in accordance with a signal having one or more data packets, such as data from one component interacting with another component in a local system, distributed system, and/or across a network such as the Internet with other systems by way of the signal.

Techniques described herein may be used for various wireless communication systems such as CDMA, TDMA, FDMA, OFDMA, SC-FDMA, and other systems. The terms "system" and "network" may often be used interchangeably. A CDMA system may implement a radio technology such as CDMA2000, Universal Terrestrial Radio Access (UTRA), etc. CDMA2000 covers IS-2000, IS-95, and IS-856 standards. IS-2000 Releases 0 and A are commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM). An OFDMA system may implement a radio technology such as Ultra Mobile Broadband (UMB), Evolved UTRA (E-UTRA), IEEE 802.11 (Wi-Fi), IEEE 802.16 (WiMAX), IEEE 802.20, Flash-OFDM™, etc. UTRA and E-UTRA are part of Universal Mobile Telecommunication System (UMTS). 3GPP Long Term Evolution (LTE) and LTE-Advanced (LTE-A) are new releases of UMTS that use E-UTRA. UTRA, E-UTRA, UMTS, LTE, LTE-A, and GSM are described in documents from an organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies, including cellular (e.g., LTE) communications over a shared radio frequency spectrum band. The description below, however, describes an LTE/LTE-A system for purposes of example, and LTE terminology is used in much of the description below, although the techniques are applicable beyond LTE/LTE-A applications (e.g., to fifth generation (5G) new radio (NR) networks or other next generation communication systems).

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in other examples.

Various aspects or features will be presented in terms of systems that can include a number of devices, components, modules, and the like. It is to be understood and appreciated that the various systems can include additional devices, components, modules, etc. and/or may not include all of the devices, components, modules etc. discussed in connection with the figures. A combination of these approaches can also be used.

FIG. 1 is a diagram illustrating an example of a wireless communications system and an access network 100. The wireless communications system (also referred to as a wireless wide area network (WWAN)) can include base stations 102, UEs 104, an Evolved Packet Core (EPC) 160, and/or a 5G Core (5GC) 190. The base stations 102 may include macro cells (high power cellular base station) and/or small cells (low power cellular base station). The macro cells can include base stations. The small cells can include femtocells, picocells, and microcells. In an example, the base stations 102 may also include gNBs 180, as described further herein. In one example, some nodes of the wireless communication system may have a modem 240 and UE communicating component 242 for receiving an indication related to a search space size to use for a demodulator, in accordance with aspects described herein. In addition, some nodes may have a modem 340 and BS communicating component 342 for configuring a search space size to use for a demodulator, in accordance with aspects described herein. Though a UE 104 is shown as having the modem 240 and UE communicating component 242 and a base station 102/gNB 180 is shown as having the modem 340 and BS communicating component 342, this is one illustrative example, and substantially any node or type of node may include a modem 240 and UE communicating component 242 and/or a modem 340 and BS communicating component 342 for providing corresponding functionalities described herein.

The base stations 102 configured for 4G LTE (which can collectively be referred to as Evolved Universal Mobile Telecommunications System (UMTS) Terrestrial Radio Access Network (E-UTRAN)) may interface with the EPC 160 through backhaul links 132 (e.g., using an S1 interface). The base stations 102 configured for 5G NR (which can collectively be referred to as Next Generation RAN (NG-RAN)) may interface with 5GC 190 through backhaul links 184. In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160 or 5GC 190) with each other over backhaul links 134 (e.g., using an X2 interface). The backhaul links 134 may be wired or wireless.

The base stations 102 may wirelessly communicate with one or more UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macro cells may be referred to as a heterogeneous network. A heterogeneous network may also include Home Evolved Node Bs (eNBs) (HeNBs), which may provide service to a restricted group, which can be referred to as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use multiple-input and multiple-output (MIMO) antenna technology, including spatial multiplexing, beamforming, and/or transmit diversity. The communication links may be through one or more carriers. The base stations 102/UEs 104 may use spectrum up to Y MHz (e.g., 5, 10, 15, 20, 100, 400, etc. MHz) bandwidth per carrier allocated in a carrier aggregation of up to a total of Yx MHz (e.g., for x component carriers) used for transmission in the DL and/or the UL direction. The carriers may or may not be adjacent to each other. Allocation of carriers may be asymmetric with respect to DL and UL (e.g., more or less carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

In another example, certain UEs 104 may communicate with each other using device-to-device (D2D) communication link 158. The D2D communication link 158 may use the DL/UL WWAN spectrum. The D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, FlashLinQ, WiMedia, Bluetooth, ZigBee, Wi-Fi based on the IEEE 802.11 standard, LTE, or NR.

The wireless communications system may further include a Wi-Fi access point (AP) 150 in communication with Wi-Fi stations (STAs) 152 via communication links 154 in a 5 GHz unlicensed frequency spectrum. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ NR and use the same 5 GHz unlicensed frequency spectrum as used by the Wi-Fi AP 150. The small cell 102', employing NR in an unlicensed frequency spectrum, may boost coverage to and/or increase capacity of the access network.

A base station 102, whether a small cell 102' or a large cell (e.g., macro base station), may include an eNB, gNodeB (gNB), or other type of base station. Some base stations, such as gNB 180 may operate in a traditional sub 6 GHz spectrum, in millimeter wave (mmW) frequencies, and/or near mmW frequencies in communication with the UE 104. When the gNB 180 operates in mmW or near mmW frequencies, the gNB 180 may be referred to as an mmW base station. Extremely high frequency (EHF) is part of the RF in the electromagnetic spectrum. EHF has a range of 30 GHz to 300 GHz and a wavelength between 1 millimeter and 10 millimeters. Radio waves in the band may be referred to as a millimeter wave. Near mmW may extend down to a frequency of 3 GHz with a wavelength of 100 millimeters. The super high frequency (SHF) band extends between 3 GHz and 30 GHz, also referred to as centimeter wave. Communications using the mmW/near mmW radio frequency band has extremely high path loss and a short range. The mmW base station 180 may utilize beamforming 182 with the UE 104 to compensate for the extremely high path loss and short range. A base station 102 referred to herein can include a gNB 180.

The EPC 160 may include a Mobility Management Entity (MME) 162, other MMES 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service, and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The 5GC 190 may include a Access and Mobility Management Function (AMF) 192, other AMFs 193, a Session Management Function (SMF) 194, and a User Plane Function (UPF) 195. The AMF 192 may be in communication with a Unified Data Management (UDM) 196. The AMF 192 can be a control node that processes the signaling between the UEs 104 and the 5GC 190. Generally, the AMF 192 can provide QoS flow and session management. User Internet protocol (IP) packets (e.g., from one or more UEs 104) can be transferred through the UPF 195. The UPF 195 can provide UE IP address allocation for one or more UEs, as well as other functions. The UPF 195 is connected to the IP Services 197. The IP Services 197 may include the Internet, an intranet, an IP Multimedia Subsystem (IMS), a PS Streaming Service, and/or other IP services.

The base station may also be referred to as a gNB, Node B, evolved Node B (eNB), an access point, a base transceiver station, a radio base station, a radio transceiver, a transceiver function, a basic service set (BSS), an extended service set (ESS), a transmit reception point (TRP), or some other suitable terminology. The base station 102 provides an access point to the EPC 160 or 5GC 190 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a large or small kitchen appliance, a healthcare device, an implant, a sensor/actuator, a display, or any other similar functioning device. Some of the UEs 104 may be referred to as IoT devices (e.g., parking meter, gas pump, toaster, vehicles, heart monitor, etc.). IoT UEs may include machine type communication (MTC)/enhanced MTC (eMTC, also referred to as category (CAT)-M, Cat M1) UEs, NB-IoT (also referred to as CAT NB1) UEs, as well as other types of UEs. In the present disclosure, eMTC and NB-IoT may refer to future technologies that may evolve from or may be based on these technologies. For example, eMTC may include FeMTC (further eMTC), eFeMTC (enhanced further eMTC), mMTC (massive MTC), etc., and NB-IoT may include eNB-IoT (enhanced NB-IoT), FeNB-IoT (further enhanced NB-IoT), etc. The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

In an example, UE communicating component 242 can transmit information to a base station 102 to allow the base station 102 to determine a search space size for a demodulator of the UE 104. For example, UE communicating component 242 can transmit a SRS, CSI feedback, or other signaling. BS communicating component 342 can receive the signaling and accordingly determine a search space size for the UE 104 to use in demodulating signals received from the base station 102 or other node of the wireless network. In this example, BS communicating component 342 can transmit an indication of the search space size to the UE 104, and UE communicating component 242 can receive the indication of the search space size, determine the search space size for its demodulator, and accordingly generate LLRs for received signals based on the search space size.

Figure 2:
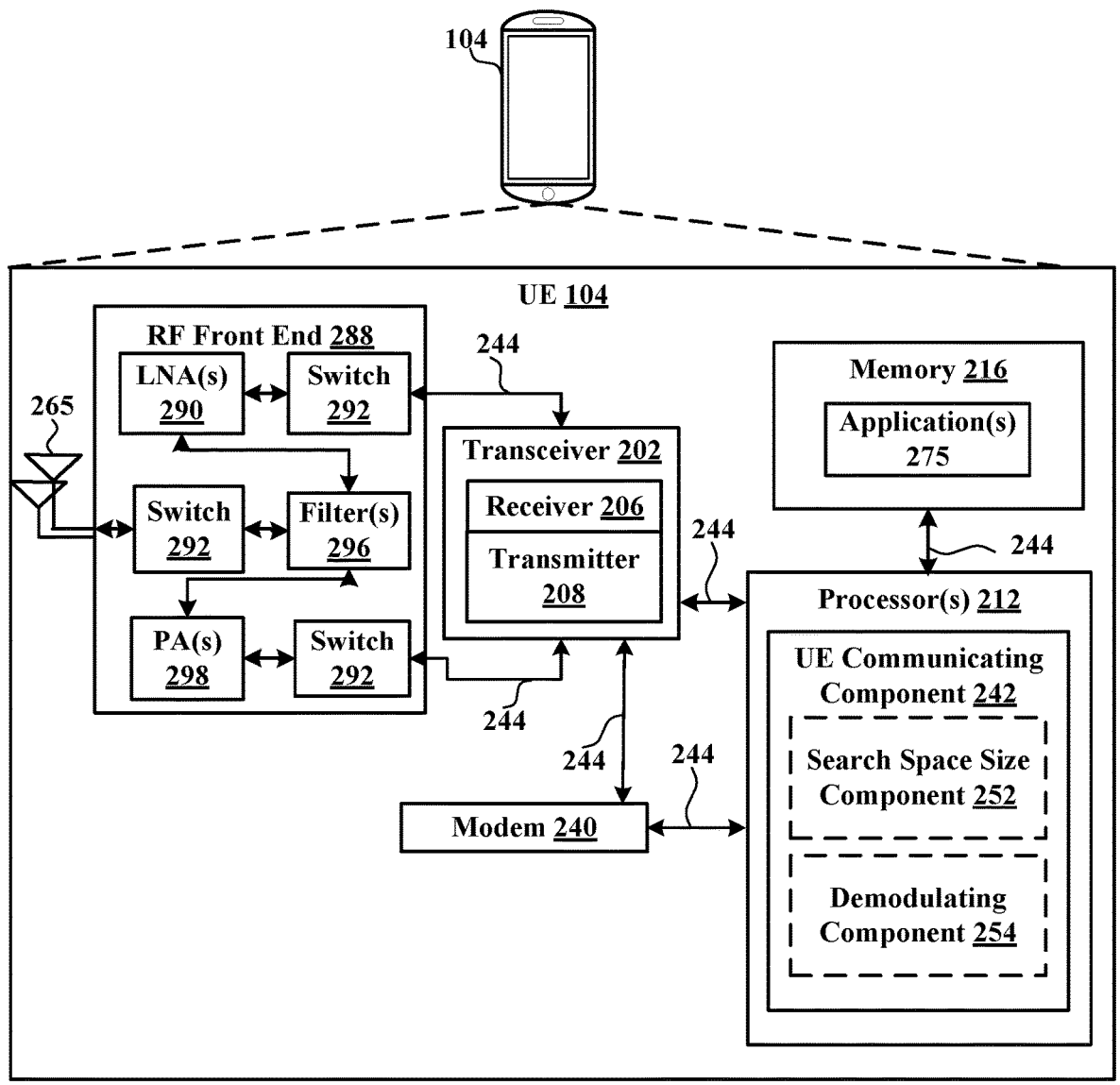
FIG. 2 is a block diagram illustrating an example of a UE, in accordance with various aspects of the present disclosure.
Figure 3:
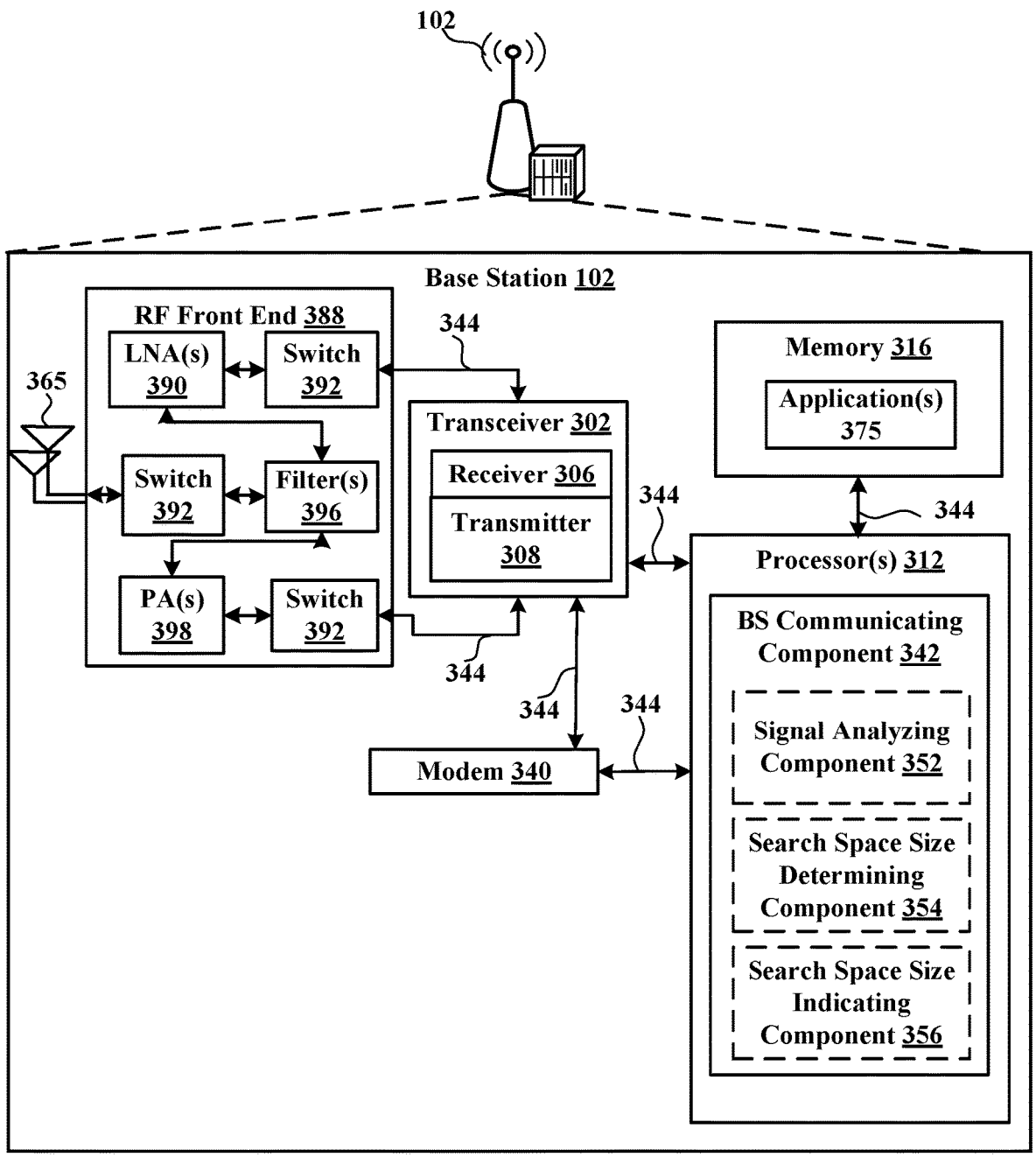
FIG. 3 is a block diagram illustrating an example of a base station, in accordance with various aspects of the present disclosure.
Figure 4:
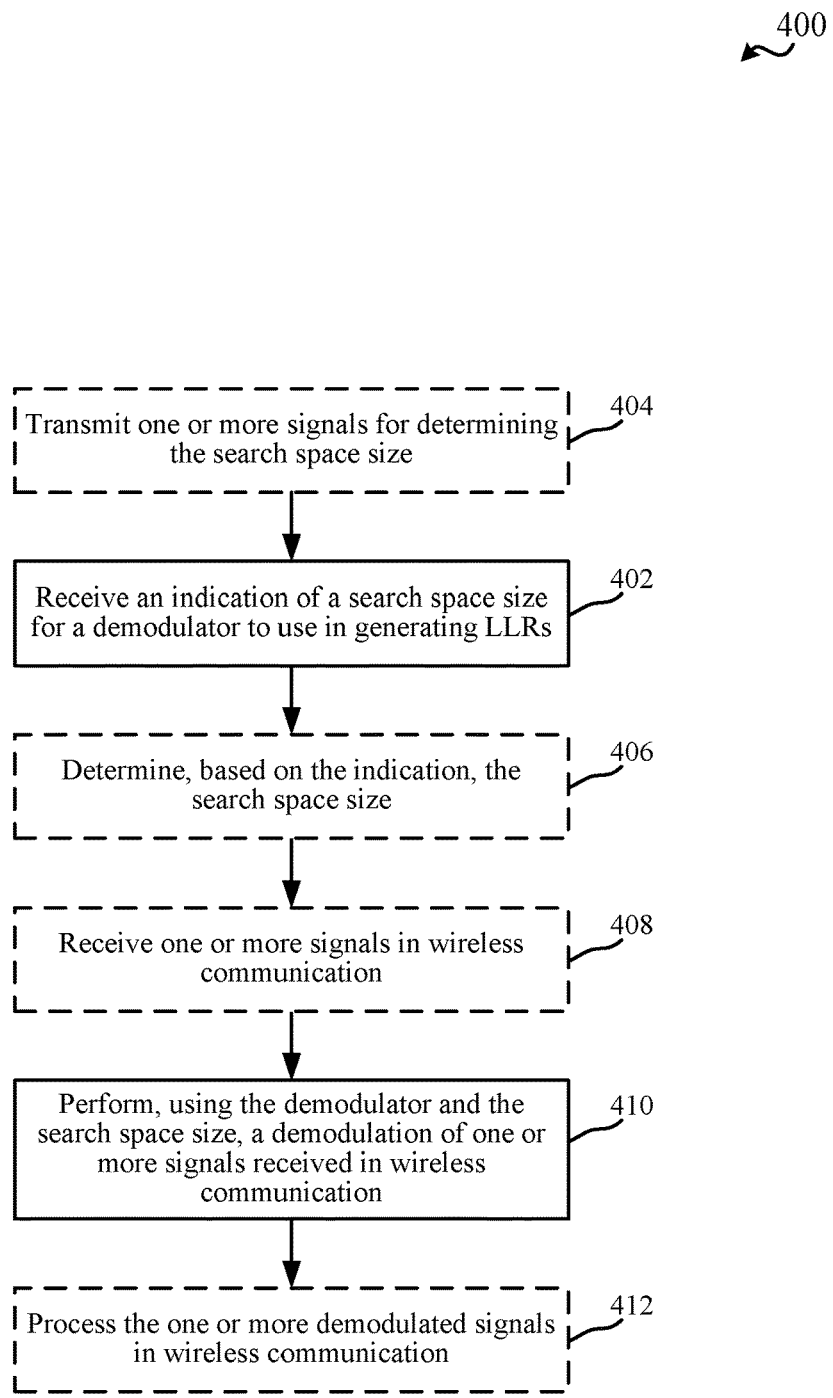
FIG. 4 is a flow chart illustrating an example of a method for determining a search space size for generating log likelihood ratios (LLR) at a demodulator, in accordance with aspects described herein.
Figure 5:
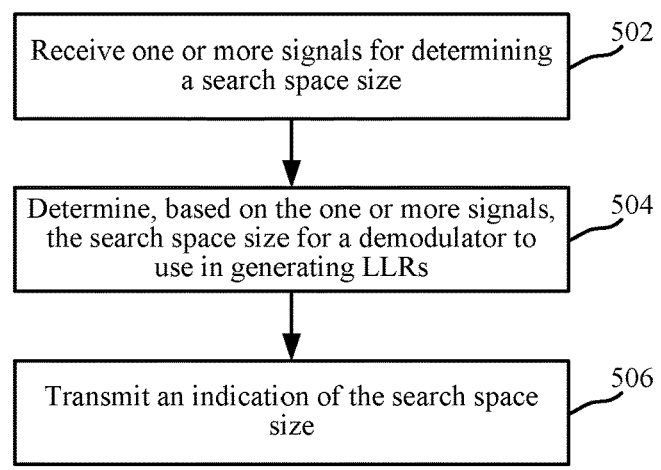
FIG. 5 is a flow chart illustrating an example of a method for configuring a search space size for a demodulator, in accordance with aspects described herein.

Turning now to FIGS. 2-7, aspects are depicted with reference to one or more components and one or more methods that may perform the actions or operations described herein, where aspects in dashed line may be optional. Although the operations described below in FIGS. 4 and 5 are presented in a particular order and/or as being performed by an example component, it should be understood that the ordering of the actions and the components performing the actions may be varied, depending on the implementation. Moreover, it should be understood that the following actions, functions, and/or described components may be performed by a specially programmed processor, a processor executing specially programmed software or computer-readable media, or by any other combination of a hardware component and/or a software component capable of performing the described actions or functions.

Referring to FIG. 2, one example of an implementation of UE 104 may include a variety of components, some of which have already been described above and are described further herein, including components such as one or more processors 212 and memory 216 and transceiver 202 in communication via one or more buses 244, which may operate in conjunction with modem 240 and/or UE communicating component 242 for receiving an indication related to a search space size to use for a demodulator, in accordance with aspects described herein.

In an aspect, the one or more processors 212 can include a modem 240 and/or can be part of the modem 240 that uses one or more modem processors. Thus, the various functions related to UE communicating component 242 may be included in modem 240 and/or processors 212 and, in an aspect, can be executed by a single processor, while in other aspects, different ones of the functions may be executed by a combination of two or more different processors. For example, in an aspect, the one or more processors 212 may include any one or any combination of a modem processor, or a baseband processor, or a digital signal processor, or a transmit processor, or a receiver processor, or a transceiver processor associated with transceiver 202. In other aspects, some of the features of the one or more processors 212 and/or modem 240 associated with UE communicating component 242 may be performed by transceiver 202.

Also, memory 216 may be configured to store data used herein and/or local versions of applications 275 or UE communicating component 242 and/or one or more of its subcomponents being executed by at least one processor 212. Memory 216 can include any type of computer-readable medium usable by a computer or at least one processor 212, such as random access memory (RAM), read only memory (ROM), tapes, magnetic discs, optical discs, volatile memory, non-volatile memory, and any combination thereof. In an aspect, for example, memory 216 may be a non-transitory computer-readable storage medium that stores one or more computer-executable codes defining UE communicating component 242 and/or one or more of its subcomponents, and/or data associated therewith, when UE 104 is operating at least one processor 212 to execute UE communicating component 242 and/or one or more of its subcomponents.

Transceiver 202 may include at least one receiver 206 and at least one transmitter 208. Receiver 206 may include hardware, firmware, and/or software code executable by a processor for receiving data, the code comprising instructions and being stored in a memory (e.g., computer-readable medium). Receiver 206 may be, for example, a radio frequency (RF) receiver. In an aspect, receiver 206 may receive signals transmitted by at least one base station 102. Additionally, receiver 206 may process such received signals, and also may obtain measurements of the signals, such as, but not limited to, Ec/Io, signal-to-noise ratio (SNR), reference signal received power (RSRP), received signal strength indicator (RSSI), etc. Transmitter 208 may include hardware, firmware, and/or software code executable by a processor for transmitting data, the code comprising instructions and being stored in a memory (e.g., computer-readable medium). A suitable example of transmitter 208 may including, but is not limited to, an RF transmitter.

Moreover, in an aspect, UE 104 may include RF front end 288, which may operate in communication with one or more antennas 265 and transceiver 202 for receiving and transmitting radio transmissions, for example, wireless communications transmitted by at least one base station 102 or wireless transmissions transmitted by UE 104. RF front end 288 may be connected to one or more antennas 265 and can include one or more low-noise amplifiers (LNAs) 290, one or more switches 292, one or more power amplifiers (PAs) 298, and one or more filters 296 for transmitting and receiving RF signals.

In an aspect, LNA 290 can amplify a received signal at a desired output level. In an aspect, each LNA 290 may have a specified minimum and maximum gain values. In an aspect, RF front end 288 may use one or more switches 292 to select a particular LNA 290 and its specified gain value based on a desired gain value for a particular application.

Further, for example, one or more PA(s) 298 may be used by RF front end 288 to amplify a signal for an RF output at a desired output power level. In an aspect, each PA 298 may have specified minimum and maximum gain values. In an aspect, RF front end 288 may use one or more switches 292 to select a particular PA 298 and its specified gain value based on a desired gain value for a particular application.

Also, for example, one or more filters 296 can be used by RF front end 288 to filter a received signal to obtain an input RF signal. Similarly, in an aspect, for example, a respective filter 296 can be used to filter an output from a respective PA 298 to produce an output signal for transmission. In an aspect, each filter 296 can be connected to a specific LNA 290 and/or PA 298. In an aspect, RF front end 288 can use one or more switches 292 to select a transmit or receive path using a specified filter 296, LNA 290, and/or PA 298, based on a configuration as specified by transceiver 202 and/or processor 212.

As such, transceiver 202 may be configured to transmit and receive wireless signals through one or more antennas 265 via RF front end 288. In an aspect, transceiver may be tuned to operate at specified frequencies such that UE 104 can communicate with, for example, one or more base stations 102 or one or more cells associated with one or more base stations 102. In an aspect, for example, modem 240 can configure transceiver 202 to operate at a specified frequency and power level based on the UE configuration of the UE 104 and the communication protocol used by modem 240.

In an aspect, modem 240 can be a multiband-multimode modem, which can process digital data and communicate with transceiver 202 such that the digital data is sent and received using transceiver 202. In an aspect, modem 240 can be multiband and be configured to support multiple frequency bands for a specific communications protocol. In an aspect, modem 240 can be multimode and be configured to support multiple operating networks and communications protocols. In an aspect, modem 240 can control one or more components of UE 104 (e.g., RF front end 288, transceiver 202) to enable transmission and/or reception of signals from the network based on a specified modem configuration. In an aspect, the modem configuration can be based on the mode of the modem and the frequency band in use. In another aspect, the modem configuration can be based on UE configuration information associated with UE 104 as provided by the network during cell selection and/or cell reselection.

In an aspect, UE communicating component 242 can optionally include a search space size component 252 for receiving an indication of a search space size, and/or a demodulating component 254 for demodulating one or more signals or generating LLRs based on the search space size, in accordance with aspects described herein.

In an aspect, the processor(s) 212 may correspond to one or more of the processors described in connection with the UE in FIG. 7. Similarly, the memory 216 may correspond to the memory described in connection with the UE in FIG. 7.

Referring to FIG. 3, one example of an implementation of base station 102 (e.g., a base station 102 and/or gNB 180, as described above) may include a variety of components, some of which have already been described above, but including components such as one or more processors 312 and memory 316 and transceiver 302 in communication via one or more buses 344, which may operate in conjunction with modem 340 and BS communicating component 342 for configuring a search space size to use for a demodulator, in accordance with aspects described herein.

The transceiver 302, receiver 306, transmitter 308, one or more processors 312, memory 316, applications 375, buses 344, RF front end 388, LNAs 390, switches 392, filters 396, PAs 398, and one or more antennas 365 may be the same as or similar to the corresponding components of UE 104, as described above, but configured or otherwise programmed for base station operations as opposed to UE operations.

In an aspect, BS communicating component 342 can optionally include a signal analyzing component 352 for analyzing a signal received from a UE for determining a search space size, a search space size determining component 354 for determining a search space size for the UE to use in demodulating signals, and/or a search space size indicating component 356 for transmitting an indication of the search space size to the UE, in accordance with aspects described herein.

In an aspect, the processor(s) 312 may correspond to one or more of the processors described in connection with the base station in FIG. 7. Similarly, the memory 316 may correspond to the memory described in connection with the base station in FIG. 7.

FIG. 4 illustrates a flow chart of an example of a method 400 for determining or receiving a search space size to use for a demodulator, in accordance with aspects described herein. In an example, a UE 104 can perform the functions described in method 400 using one or more of the components described in FIGS. 1-2.

In method 400, at Block 402, an indication of a search space size for a demodulator to use in generating LLRs can be received. In an aspect, search space size component 252, e.g., in conjunction with processor(s) 212, memory 216, transceiver 202, UE communicating component 242, etc., can receive the indication of the search space size for the demodulator to use in generating LLRs. For example, a different node, such as a base station 102, can determine the search space size for the UE 104 to use in demodulating signals received in wireless communication, and thus UE communicating component 242 can receive the indication of the search space size from the different node, such as base station 102. In an example, the indication of the search space size can include a numeric representation of the search space size, a parameter on which the UE 104 can compute or otherwise determine the search space size, etc.

In an example, the different node can determine the search space size using a processor-intensive algorithm that may be too complex or use too much power or processing resources if performed by the UE 104. In addition, for example, the different node may determine the search space size based on other considerations or experiences of other UEs known or reported to the different node. This can allow for more accurate search space size determination for the specific UE 104. In an example, search space size component 252 can receive the indication of the search space size in downlink control information (DCI) from the base station 102 or in other dedicated control signaling for the UE 104.

In method 400, optionally at Block 404, one or more signals for determining the search space size can be transmitted. In an aspect, search space size component 252, e.g., in conjunction with processor(s) 212, memory 216, transceiver 202, UE communicating component 242, etc., can transmit the one or more signals (e.g., uplink signals transmitted by the UE 104) for determining the search space size. For example, the one or more signals may include a SRS, CSI feedback, or other signals that can indicate a channel quality value, such as a measurement of radio environment (e.g., a measurement of channel or signal quality or power of a channel or signal from a base station 102 or other node). For example, a measurement of channel or signal quality or power, which may be referred to herein as a channel quality value, may include a received signal strength indicator (RSSI), reference signal received power (RSRP), reference signal received quality (RSRQ), signal-to-noise ratio (SNR), signal-to-interference-and-noise ratio (SINR), etc. In any case, search space size component 252 may receive the indication of search space size based on transmitting the one or more signals.

In method 400, optionally at Block 406, the search space size can be determined based on the indication. In an aspect, search space size component 252, e.g., in conjunction with processor(s) 212, memory 216, transceiver 202, UE communicating component 242, etc., can determine, based on the indication, the search space size. For example, search space size component 252 can compute the search space size based on the indication where the indication includes one or more parameters for computing the search space size. For example, where the demodulator of the UE 104 uses $2^M$ quadrature amplitude modulation (QAM), the indication of the search space size can include a reduction parameter i, which can be determined based on the one or more signals transmitted by the UE 104 at Block 404. In this example, search space size component 252 can receive the indication as the reduction parameter i at Block 404, and can determine the search space size as, or based on, $2^{M-i}$.

In method 400, optionally at Block 408, one or more signals can be received in wireless communication. In an aspect, UE communicating component 242, e.g., in conjunction with processor(s) 212, memory 216, transceiver 202, etc., can receive the one or more signals in wireless communication. For example, UE communicating component 242 can receive the one or more signals from the base station 102 (e.g., as downlink signals over designated downlink resources) or from one or more other base stations or UEs or other nodes in the wireless network.

In method 400, at Block 410, a demodulation of the one or more signals received in wireless communication can be performed using the demodulator and the search space size. In an aspect, demodulating component 254, e.g., in conjunction with processor(s) 212, memory 216, transceiver 202, UE communicating component 242, etc., can perform, using the demodulator and the search space size, the demodulation of the one or more signals received in wireless communication. For example, as described, the demodulator can be a PSRD demodulator or other type of demodulator that determines or generates LLRs based on a search space. In this example, demodulating component 254 can use the determined search space size in using a search space over a constellation for generating the LLRs via the demodulator.

Figure 6:
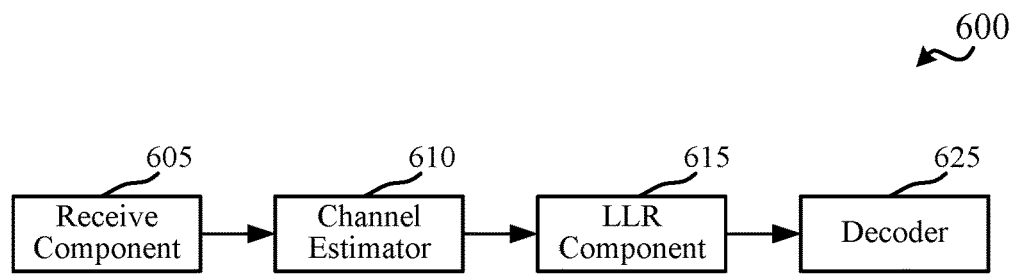
FIG. 6 is a block diagram of an example of a per-stream recursive demapping (PSRD) demodulator.
Figure 6:
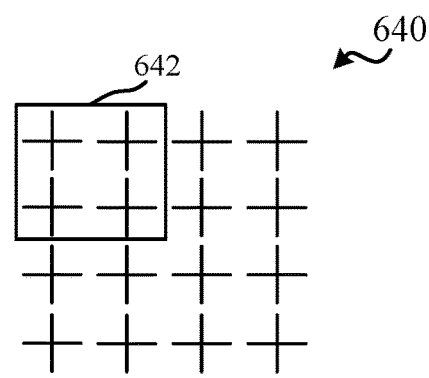

FIG. 6 illustrates an example of a PSRD demodulator 600 that generates LLRs based on a search space for demodulating received signals in accordance with aspects of the present disclosure. In some examples, PSRD demodulator 600 may include, or be communicatively coupled with, a receive component 605, channel estimator 610, LLR component 615, and decoder 625. In addition, for example, demodulating component 254 can include, or can be communicatively coupled with or can communicate with, at least a portion of PSRD demodulator 600 to demodulate received signals based on a received or determined search space size.

As described with reference to FIG. 4, PSRD demodulator 600 can be used to demodulate one or more transmissions received (e.g., from a base station 102) at receive component 605. Receive component 605 can be, or can be communicatively coupled with, a receiver of the UE 104 (e.g., such as a receiver 206 portion of transceiver 202). In an example, channel estimator 610, LLR component 615, decoder 625, etc. can also be part of, or communicatively coupled with, the receiver 206, an associated receiver processor (e.g., Rx processor 758) or other processor, RF front end 288, modem 240, and/or the like. In some cases, the transmissions may correspond to one or more symbols (e.g., one or more modulated signals) from one or more layers (e.g., MIMO), received on the same resource element (RE). Receive component 605 may produce a vector $\vec{y}$, where vector $\vec{y}$ can be defined according to:

$$\vec{y} = H\vec{x} + \vec{n}$$

where H is a matrix representation of the channel over which the transmission is received, $\vec{x}$ is the vector of precoded symbols from multiple layers at a RE of the transmission, and $\vec{n}$ is the vector of thermal noise at the RE of the transmission. Channel estimator 410 may determine matrix H, where matrix H is the matrix representation of the received channel over which the transmissions are received, of a dimension of receive (Rx) antennas by layer, and can be QR decomposed into H=QR, where R can be an upper diagonal matrix. In addition, vector $\vec{x}$ may correspond to a set of constellation symbols in a constellation 640, where each constellation symbol may have a defined amplitude and phase of a set of amplitudes and phrases within a modulation scheme (e.g., quadrature phase shift keying (QPSK), 16-QAM, 64-QAM, etc.) used for modulating symbols of the transmission. Further, each constellation symbol may correspond to a unique bit sequence that may be represented by a received symbol.

For example, a base station 102 may transmit transmissions according to a 16 QAM modulation and coding scheme (MCS) such to include sixteen constellation symbols in constellation 640. In such a case, each constellation symbol may correspond to one of the sixteen unique bit sequences that may be represented by a transmitted symbol. Where a base station 102 transmits transmissions according to a 64 QAM MCS, the transmission may include sixty-four constellation symbols such that each constellation symbol may correspond to one of the sixty-four unique bit sequences that may be represented by a transmitted symbol.

The generation of the LLR for some layer of interest (e.g., the last layer) may be based on a search over some search space around the received symbol of the layer of interest. The generation of the LLR for the layer of interest can include calculating a metric for each element of the search space. The metric may be composed from the hypothesis from the search space and some decisions over the interfering layers that are influenced from the current assumed hypothesis of the layer of interest. The size of the search space may therefore have an important factor on the demodulator complexity. At most the search space size can be over the entire constellation symbols (e.g., size K for a K-QAM constellation).

LLR component 615 may generate the LLRs based on QR decomposition, for a bit j, according to the following formula:

$$LLR_j = \min_{i \in M_j(0)} \{\|\vec{y} - R\vec{x}_i\|^2\} - \min_{i \in M_j(1)} \{\|\vec{y} - R\vec{x}_i\|^2\}$$

where $\vec{x}_i$ represents the vector of estimated symbols for the received signal vector $\vec{y}$. LLR component 615 can provide the LLRs to decoder 625, which may utilize the LLRs to determine a received bit sequence of the symbol and may perform an error detection procedure (e.g., a cyclic redundancy check (CRC)) on the received bit sequence. Upon determining that the determined LLR passes the error detection procedure, decoder 625 may generate acknowledgement (ACK) feedback to transmit to the base station 102. Upon determining that the determined LLR fails the error detection procedure, decoder 625 may generate negative-acknowledgement (NACK) feedback to transmit to the base station 102.

In accordance with aspects described herein, however, search space determining component 252 may determine the search space size of constellation 640 for LLR component 615 to use in generating LLRs. In an example, search space determining component 252 can receive an indication of search space size a reduction parameter i, where i=2. In this example, search space determining component 252 can determine to reduce the search space size to $2^{M-i} = 2^{4-2} = 4$, as shown by reduced search space 642. More generally the search space can be defined by any positive integer J (e.g., J<=K, for a K-QAM modulation). In this example, LLR component 615 can determine LLRs based on the reduced search space 642, which may lower complexity and/or processing power required to generate the LLRs, and may allow for decoding based on the reduced search space 642 where channel conditions achieve a threshold (e.g., where the SRS, CSI, etc., exhibit desirable properties or measurements as described further herein.

In method 400, optionally at Block 412, the one or more demodulated signals can be processed in wireless communication. In an aspect, UE communicating component 242, e.g., in conjunction with processor(s) 212, memory 216, transceiver 202, etc., can process the one or more demodulated signals in wireless communication. For example, UE communicating component 242 can pass a representative bit or bitstream to an upper layer for processing, transmit feedback for the received signals (e.g., ACK/NACK, as described above), and/or the like.

FIG. 5 illustrates a flow chart of an example of a method 500 for configuring a search space size to use for a demodulator, in accordance with aspects described herein. In an example, a base station 102 or other device can perform the functions described in method 500 using one or more of the components described in FIGS. 1-3.

In method 500, at Block 502, one or more signals for determining a search space size can be received. In an aspect, signal analyzing component 352, e.g., in conjunction with processor(s) 312, memory 316, transceiver 302, BS communicating component 342, etc., can receive the one or more signals for determining the search space size. For example, signal analyzing component 352 can receive the one or more signals from the UE 104, such as a SRS, CSI feedback, or other signals from, or based on, which a radio environment at the UE 104 can be determined. For example, signal analyzing component 352 can determine the one or more signals as a latest received SRS, and can measure one or more properties of the SRS (e.g., RSSI, RSRP, RSRQ, SNR, SINR, etc.) for determining the search space size for a demodulator of the UE 104. In another example, signal analyzing component 352 can determine, from the one or more signals, a delay from the latest received SRS for determining the search space size for a demodulator of the UE 104. In yet another example, signal analyzing component 352 can determine channel quality indicated in CSI feedback for determining the search space size for a demodulator of the UE 104.

In method 500, at Block 504, the search space size for a demodulator to use in generating LLRs can be determined based on the one or more signals. In an aspect, search space size determining component 354, e.g., in conjunction with processor(s) 312, memory 316, transceiver 302, BS communicating component 342, etc., can determine, based on the one or more signals, the search space size for the demodulator (e.g., of a UE 104) to use in generating LLRs.

For example, search space size determining component 354 can determine the search space size for the UE 104 to use in demodulating signals received from the base station 102 or from other nodes of the wireless network. For example, search space size determining component 354 can determine the search space size for the UE 104 based on properties of the one or more signals received at Block 502, such that the search space size is determined for the UE 104 in its specific radio environment. As described, performing the search space size determination at the base station 102 may allow for more complex or intuitive determination logic to be performed.

In one specific example, search space size determining component 354 can determine the search space size for the UE 104 by inputting the signal metrics or properties received or determined from the one or more signals (e.g., a channel quality value) into a neural network or other AI process. The output of the neural network or AI process may be a reduction parameter, i, (or J for the more general case described above) for determining the search space (e.g., for a specific QAM or otherwise). For example, the more desirable the radio environment (e.g., the better the CSI feedback, the higher the measurement of SRS, etc.), search space size determining component 354 can determine a higher reduction parameter. In an example, the neural network can be used to model previous determined input (e.g., SRS properties or delay, CSI feedback, etc.) and how associated reduction parameters resulted in successful (e.g., ACK) or unsuccessful (NACK) in demodulation. In one example, the neural network can be modeled at a specific base station 102 to model the parameters of UEs 104 that have communicated with that base station 102 over a period of time. In another example, the neural network can be modeled based on simulated results or results of multiple base stations, and provided to the base station 102 for determining search space size (e.g., as a reduction parameter or otherwise).

In method 500, at Block 506, an indication of the search space size can be transmitted. In an aspect, search space size indicating component 356, e.g., in conjunction with processor(s) 312, memory 316, transceiver 302, BS communicating component 342, etc., can transmit the indication of the search space size. As described, for example, search space size indicating component 356 can transmit the indication of the search space size to a UE 104 in DCI or other signaling to allow the UE 104 to determine the search space size for demodulating signals received from the base station 102, or other network nodes.

Figure 7:
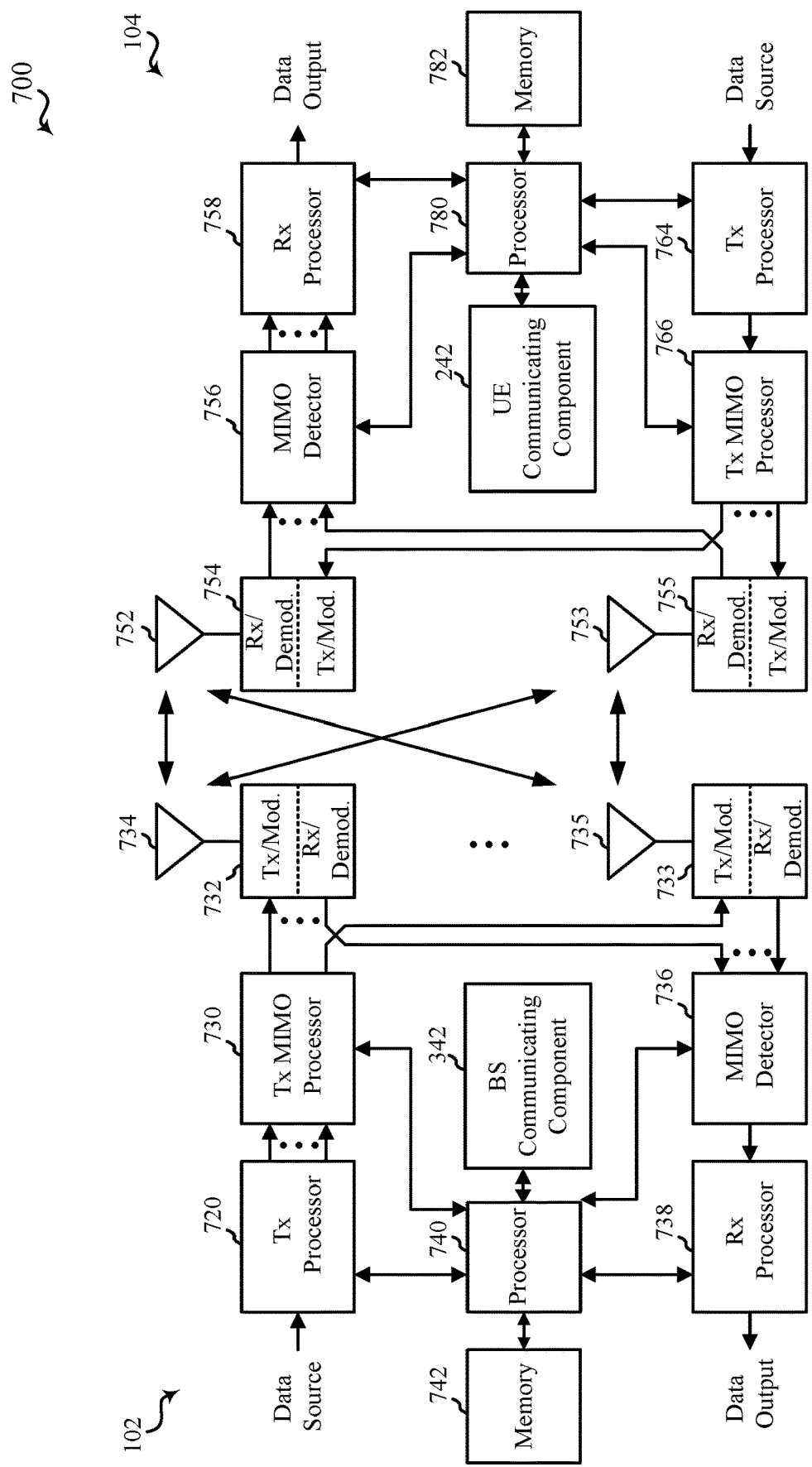
FIG. 7 is a block diagram illustrating an example of a MIMO communication system including a base station and a UE, in accordance with various aspects of the present disclosure.

FIG. 7 is a block diagram of a MIMO communication system 700 including a base station 102 and a UE 104. The MIMO communication system 700 may illustrate aspects of the wireless communication access network 100 described with reference to FIG. 1. The base station 102 may be an example of aspects of the base station 102 described with reference to FIG. 1. The base station 102 may be equipped with antennas 734 and 735, and the UE 104 may be equipped with antennas 752 and 753. In the MIMO communication system 700, the base station 102 may be able to send data over multiple communication links at the same time. Each communication link may be called a "layer" and the "rank" of the communication link may indicate the number of layers used for communication. For example, in a 2×2 MIMO communication system where base station 102 transmits two "layers," the rank of the communication link between the base station 102 and the UE 104 is two.

At the base station 102, a transmit (Tx) processor 720 may receive data from a data source. The transmit processor 720 may process the data. The transmit processor 720 may also generate control symbols or reference symbols. A transmit MIMO processor 730 may perform spatial processing (e.g., precoding) on data symbols, control symbols, or reference symbols, if applicable, and may provide output symbol streams to the transmit modulator/demodulators 732 and 733. Each modulator/demodulator 732 through 733 may process a respective output symbol stream (e.g., for OFDM, etc.) to obtain an output sample stream. Each modulator/demodulator 732 through 733 may further process (e.g., convert to analog, amplify, filter, and upconvert) the output sample stream to obtain a DL signal. In one example, DL signals from modulator/demodulators 732 and 733 may be transmitted via the antennas 734 and 735, respectively.

The UE 104 may be an example of aspects of the UEs 104 described with reference to FIGS. 1-2. At the UE 104, the UE antennas 752 and 753 may receive the DL signals from the base station 102 and may provide the received signals to the modulator/demodulators 754 and 755, respectively. Each modulator/demodulator 754 through 755 may condition (e.g., filter, amplify, downconvert, and digitize) a respective received signal to obtain input samples. Each modulator/demodulator 754 through 755 may further process the input samples (e.g., for OFDM, etc.) to obtain received symbols. A MIMO detector 756 may obtain received symbols from the modulator/demodulators 754 and 755, perform MIMO detection on the received symbols, if applicable, and provide detected symbols. A receive (Rx) processor 758 may process (e.g., demodulate, deinterleave, and decode) the detected symbols, providing decoded data for the UE 104 to a data output, and provide decoded control information to a processor 780, or memory 782.

The processor 780 may in some cases execute stored instructions to instantiate a UE communicating component 242 (see e.g., FIGS. 1 and 2).

On the uplink (UL), at the UE 104, a transmit processor 764 may receive and process data from a data source. The transmit processor 764 may also generate reference symbols for a reference signal. The symbols from the transmit processor 764 may be precoded by a transmit MIMO processor 766 if applicable, further processed by the modulator/demodulators 754 and 755 (e.g., for SC-FDMA, etc.), and be transmitted to the base station 102 in accordance with the communication parameters received from the base station 102. At the base station 102, the UL signals from the UE 104 may be received by the antennas 734 and 735, processed by the modulator/demodulators 732 and 733, detected by a MIMO detector 736 if applicable, and further processed by a receive processor 738. The receive processor 738 may provide decoded data to a data output and to the processor 740 or memory 742.

The processor 740 may in some cases execute stored instructions to instantiate a BS communicating component 342 (see e.g., FIGS. 1 and 3).

The components of the UE 104 may, individually or collectively, be implemented with one or more ASICs adapted to perform some or all of the applicable functions in hardware. Each of the noted modules may be a means for performing one or more functions related to operation of the MIMO communication system 700. Similarly, the components of the base station 102 may, individually or collectively, be implemented with one or more application specific integrated circuits (ASICs) adapted to perform some or all of the applicable functions in hardware. Each of the noted components may be a means for performing one or more functions related to operation of the MIMO communication system 700.

The following aspects are illustrative only and aspects thereof may be combined with aspects of other embodiments or teaching described herein, without limitation.

Aspect 1 is an apparatus for wireless communication including a transceiver, a memory configured to store instructions, a demodulator communicatively coupled with the memory and the transceiver that demodulates signals received via the transceiver, and one or more processors communicatively coupled with the demodulator, the memory, and the transceiver. The one or more processors are configured to receive, from a base station, an indication of a search space size for the demodulator to use in generating LLRs, and perform, using the demodulator and the search space size, a demodulation of one or more signals received in wireless communication.

In Aspect 2, the apparatus of Aspect 1 includes where the one or more processors are further configured to transmit, to the base station, one or more uplink signals for determining the search space size, where the one or more processors are configured to receive the indication of the search space size based on transmitting the one or more uplink signals.

In Aspect 3, the apparatus of Aspect 2 includes where the one or more uplink signals include at least one of a CSI report of a received channel or a SRS.

In Aspect 4, the apparatus of any of Aspects 1 to 3 includes where the indication of the search space size includes one or more parameters for determining the search space size.

In Aspect 5, the apparatus of Aspect 4 includes where the one or more processors are further configured to determine the search space size including calculating the search space size based on the one or more parameters.

In Aspect 6, the apparatus of Aspect 5 includes where the one or more processors are configured to calculate the search space size as a power of two determined based on the one or more parameters.

In Aspect 7, the apparatus of any of Aspects 1 to 6 includes where the search space size corresponds to a level of QAM for performing the demodulation.

In Aspect 8, the apparatus of any of Aspects 1 to 7 includes where the one or more processors are configured to receive the indication of the search space size in a DCI from the base station.

Aspect 9 is an apparatus for wireless communication including a transceiver, a memory configured to store instructions, and one or more processors communicatively coupled with the memory and the transceiver. The one or more processors are configured to receive, from a UE, one or more uplink signals, determine, based on the one or more uplink signals, a search space size for a demodulator of the UE to use in generating LLRs for one or more received signals, and transmit, to the UE, an indication of a search space size.

In Aspect 10, the apparatus of Aspect 9 includes where the one or more uplink signals include at least one of a CSI report of a received channel or a SRS.

In Aspect 11, the apparatus of any of Aspects 9 or 10 includes where the indication of the search space size includes one or more parameters for determining the search space size.

In Aspect 12, the apparatus of Aspect 11 includes where the one or more parameters include a value for determining the search space size as a power of two.

In Aspect 13, the apparatus of any of Aspects 9 to 12 includes where the search space size corresponds to a level of QAM for performing the demodulation.

In Aspect 14, the apparatus of any of Aspects 9 to 13 includes where the one or more processors are configured to determine the search space size based on a channel quality value determined from the one or more uplink signals.

In Aspect 15, the apparatus of any of Aspects 9 to 14 includes where the one or more processors are configured to determine the search space size based on an artificial intelligence process based on a channel quality value determined from the one or more uplink signals.

In Aspect 16, the apparatus of any of Aspects 9 to 15 includes where the one or more processors are configured to transmit the indication of the search space size to the UE in a DCI.

Aspect 17 is a method for wireless communication including receiving, from a base station, an indication of a search space size for a demodulator to use in generating LLRs, and performing, using the demodulator and the search space size, a demodulation of one or more signals received in wireless communication.

In Aspect 18, the method of Aspect 17 includes transmitting, to the base station, one or more uplink signals for determining the search space size, where receiving the indication of the search space size is based on transmitting the one or more uplink signals.

In Aspect 19, the method of Aspect 18 includes where the one or more uplink signals include at least one of a CSI report of a received channel or a SRS.

In Aspect 20, the method of any of Aspects 17 to 19 includes where the indication of the search space size includes one or more parameters for determining the search space size.

In Aspect 21, the method of Aspect 20 includes determining the search space size including calculating the search space size based on the one or more parameters.

In Aspect 22, the method of Aspect 21 includes where calculating the search space size includes calculating the search space size as a power of two determined based on the one or more parameters.

In Aspect 23, the method of any of Aspects 17 to 22 includes where the search space size corresponds to a level of QAM for performing the demodulation.

In Aspect 24, the method of any of Aspects 17 to 23 includes where receiving the indication of the search space size includes receiving a DCI from the base station that includes the indication of the search space size.

Aspect 25 is a method for wireless communication including receiving, from a UE, one or more uplink signals, determining, based on the one or more uplink signals, a search space size for a demodulator of the UE to use in generating LLRs for one or more received signals, and transmitting, to the UE, an indication of a search space size.

In Aspect 26, the method of Aspect 25 includes where the one or more uplink signals include at least one of a CSI report of a received channel or a SRS.

In Aspect 27, the method of any of Aspects 25 or 26 includes where the indication of the search space size includes one or more parameters for determining the search space size.

In Aspect 28, the method of Aspect 27 includes where the one or more parameters include a value for determining the search space size as a power of two.

In Aspect 29, the method of any of Aspects 25 to 28 includes where the search space size corresponds to a level of QAM for performing the demodulation.

In Aspect 30, the method of any of Aspects 25 to 29 includes where determining the search space size is based on a channel quality value determined from the one or more uplink signals.

In Aspect 31, the method of any of Aspects 25 to 30 includes where determining the search space size is based on an artificial intelligence process based on a channel quality value determined from the one or more uplink signals.

In Aspect 32, the method of any of Aspects 25 to 31 includes where transmitting the indication of the search space size includes transmitting, to the UE, a DCI that includes the indication of the search space size.

Aspect 33 is an apparatus for wireless communication including means for receiving, from a base station, an indication of a search space size for a demodulator to use in generating LLRs, and means for performing, using the demodulator and the search space size, a demodulation of one or more signals received in wireless communication.

In Aspect 34, the apparatus of Aspect 33 includes means for transmitting, to the base station, one or more uplink signals for determining the search space size, where the means for receiving receives the indication of the search space size based on the means for transmitting the one or more uplink signals.

In Aspect 35, the apparatus of Aspect 34 includes where the one or more uplink signals include at least one of a CSI report of a received channel or a SRS.

In Aspect 36, the apparatus of any of Aspects 33 to 35 includes where the indication of the search space size includes one or more parameters for determining the search space size.

In Aspect 37, the apparatus of Aspect 36 includes means for determining the search space size including calculating the search space size based on the one or more parameters.

In Aspect 38, the apparatus of Aspect 37 includes where the means for determining calculates the search space size as a power of two determined based on the one or more parameters.

In Aspect 39, the apparatus of any of Aspects 33 to 38 includes where the search space size corresponds to a level of QAM for performing the demodulation.

In Aspect 40, the apparatus of any of Aspects 33 to 39 includes where the means for receiving receives the indication of the search space size in a DCI from the base station.

Aspect 41 is an apparatus for wireless communication including means for receiving, from a UE, one or more uplink signals, means for determining, based on the one or more uplink signals, a search space size for a demodulator of the UE to use in generating LLRs for one or more received signals, and means for transmitting, to the UE, an indication of a search space size.

In Aspect 42, the apparatus of Aspect 41 includes where the one or more uplink signals include at least one of a CSI report of a received channel or a SRS.

In Aspect 43, the apparatus of any of Aspects 41 or 42 includes where the indication of the search space size includes one or more parameters for determining the search space size.

In Aspect 44, the apparatus of Aspect 43 includes where the one or more parameters include a value for determining the search space size as a power of two.

In Aspect 45, the apparatus of any of Aspects 41 to 44 includes where the search space size corresponds to a level of QAM for performing the demodulation.

In Aspect 46, the apparatus of any of Aspects 41 to 45 includes where the means for determining determines the search space size based on a channel quality value determined from the one or more uplink signals.

In Aspect 47, the apparatus of any of Aspects 41 to 46 includes where the means for determining determines the search space size based on an artificial intelligence process based on a channel quality value determined from the one or more uplink signals.

In Aspect 48, the apparatus of any of Aspects 41 to 47 includes where the means for transmitting transmits the indication of the search space size to the UE in a DCI.

Aspect 49 is a computer-readable medium including code executable by one or more processors for wireless communication. The code includes code for receiving, from a base station, an indication of a search space size for a demodulator to use in generating LLRs, and performing, using the demodulator and the search space size, a demodulation of one or more signals received in wireless communication.

In Aspect 50, the computer-readable medium of Aspect 49 includes code for transmitting, to the base station, one or more uplink signals for determining the search space size, where the code for receiving receives the indication of the search space size based on the code for transmitting the one or more uplink signals.

In Aspect 51, the computer-readable medium of Aspect 50 includes where the one or more uplink signals include at least one of a CSI report of a received channel or a SRS.

In Aspect 52, the computer-readable medium of any of Aspects 49 to 51 includes where the indication of the search space size includes one or more parameters for determining the search space size.

In Aspect 53, the computer-readable medium of Aspect 52 includes code for determining the search space size including calculating the search space size based on the one or more parameters.

In Aspect 54, the computer-readable medium of Aspect 53 includes where the code for determining calculates the search space size as a power of two determined based on the one or more parameters.

In Aspect 55, the computer-readable medium of any of Aspects 49 to 54 includes where the search space size corresponds to a level of QAM for performing the demodulation.

In Aspect 56, the computer-readable medium of any of Aspects 49 to 55 includes where the code for receiving receives the indication of the search space size in a DCI from the base station.

Aspect 57 is a computer-readable medium including code executable by one or more processors for wireless communication. The code includes code for receiving, from a UE, one or more uplink signals, determining, based on the one or more uplink signals, a search space size for a demodulator of the UE to use in generating LLRs for one or more received signals, and transmitting, to the UE, an indication of a search space size.

In Aspect 58, the computer-readable medium of Aspect 57 includes where the one or more uplink signals include at least one of a CSI report of a received channel or a SRS.

In Aspect 59, the computer-readable medium of any of Aspects 57 or 58 includes where the indication of the search space size includes one or more parameters for determining the search space size.

In Aspect 60, the computer-readable medium of Aspect 59 includes where the one or more parameters include a value for determining the search space size as a power of two.

In Aspect 61, the computer-readable medium of any of Aspects 57 to 60 includes where the search space size corresponds to a level of QAM for performing the demodulation.

In Aspect 62, the computer-readable medium of any of Aspects 57 to 61 includes where the code for determining determines the search space size based on a channel quality value determined from the one or more uplink signals.

In Aspect 63, the computer-readable medium of any of Aspects 57 to 62 includes where the code for determining determines the search space size based on an artificial intelligence process based on a channel quality value determined from the one or more uplink signals.

In Aspect 64, the computer-readable medium of any of Aspects 57 to 63 includes where the code for transmitting transmits the indication of the search space size to the UE in a DCI.

The above detailed description set forth above in connection with the appended drawings describes examples and does not represent the only examples that may be implemented or that are within the scope of the claims. The term "example," when used in this description, means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, computer-executable code or instructions stored on a computer-readable medium, or any combination thereof.

The various illustrative blocks and components described in connection with the disclosure herein may be implemented or performed with a specially programmed device, such as but not limited to a processor, a digital signal processor (DSP), an ASIC, a field programmable gate array (FPGA) or other programmable logic device, a discrete gate or transistor logic, a discrete hardware component, or any combination thereof designed to perform the functions described herein. A specially programmed processor may be a microprocessor, but in the alternative, the processor may be any conventional processor, controller, microcontroller, or state machine. A specially programmed processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a non-transitory computer-readable medium. Other examples and implementations are within the scope and spirit of the disclosure and appended claims. For example, due to the nature of software, functions described above can be implemented using software executed by a specially programmed processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C).

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the common principles defined herein may be applied to other variations without departing from the spirit or scope of the disclosure. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise. Thus, the disclosure is not to be limited to the examples and designs described herein but is to be accorded the widest scope consistent with the principles and novel features disclosed herein.

What is claimed is:

1. An apparatus for wireless communication, comprising:
a transceiver;
a memory configured to store instructions;
a per-stream recursive demapping (PSRD) demodulator communicatively coupled with the memory and the transceiver that demodulates signals received via the transceiver at least in part by generating log likelihood ratios (LLRs) by searching over a constellation corresponding to a search space; and
one or more processors communicatively coupled with the PSRD demodulator, the memory, and the transceiver, wherein the one or more processors are configured to:

receive, from a base station, an indication of a search space size of a search space for the PSRD demodulator to use in generating the LLRs;

receive, from the base station, one or more signals within the search space; and perform, using the PSRD demodulator, a demodulation of the one or more signals based on generating the LLRs by searching, based on the search space size, over the constellation corresponding to the search space.

2. The apparatus of claim 1, wherein the one or more processors are further configured to transmit, to the base station, one or more uplink signals for determining the search space size, wherein the one or more processors are configured to receive the indication of the search space size based on transmitting the one or more uplink signals.

3. The apparatus of claim 2, wherein the one or more uplink signals include at least one of a channel state information (CSI) report of a received channel or a sounding reference signal (SRS).

4. The apparatus of claim 1, wherein the PSRD demodulator is configured to perform the demodulation of the one or more signals based on a level of quadrature amplitude modulation that is correlated to the search space size.

5. The apparatus of claim 1 wherein the one or more processors are further configured to determine the search space size including calculating the search space size based on one or more parameters of the indication of the search space size.

6. The apparatus of claim 5, wherein the one or more processors are configured to calculate the search space size as a power of two determined based on the one or more parameters.

7. The apparatus of claim 1, wherein the PSRD demodulator is configured to perform the demodulation based on a QR decomposition over a vector of estimated symbols from a received signal vector for the one or more signals.

8. The apparatus of claim 1, wherein the one or more processors are configured to receive the indication of the search space size in a downlink control information (DCI) from the base station.

9. An apparatus for wireless communication, comprising:
a transceiver;
a memory configured to store instructions; and
one or more processors communicatively coupled with the memory and the transceiver, wherein the one or more processors are configured to:
receive, from a user equipment (UE), one or more uplink signals;
determine, based on the one or more uplink signals, a search space size of a search space for a per-stream recursive demapping (PSRD) demodulator of the UE to use in demodulating signals received from the apparatus at least in part by generating log likelihood ratios (LLRs) by searching over a constellation corresponding to the search space of the search space size; and
transmit, to the UE, an indication of a search space size.

10. The apparatus of claim 9, wherein the one or more uplink signals include at least one of a channel state information (CSI) report of a received channel or a sounding reference signal (SRS).

11. The apparatus of claim 9, wherein the indication of the search space size includes one or more parameters for determining the search space size.

12. The apparatus of claim 11, wherein the one or more parameters include a value for determining the search space size as a power of two.

13. The apparatus of claim 9, wherein the search space size corresponds to a level of quadrature amplitude modulation (QAM) for performing demodulation by the PSRD demodulator.

14. The apparatus of claim 9, wherein the one or more processors are configured to determine the search space size based on a channel quality value determined from the one or more uplink signals.

15. The apparatus of claim 9, wherein the one or more processors are configured to determine the search space size based on an artificial intelligence process based on a channel quality value determined from the one or more uplink signals.

16. The apparatus of claim 9, wherein the one or more processors are configured to transmit the indication of the search space size to the UE in a downlink control information (DCI).

17. A method for wireless communication, comprising:
receiving, from a base station, an indication of a search space size of a search space for a per-stream recursive demapping (PSRD) demodulator to use in generating log likelihood ratios (LLRs), wherein the PSRD demodulator is configured to demodulate signals received via a transceiver at least in part by generating log likelihood ratios (LLRs) by searching over a constellation corresponding to a search space;
receiving, from the base station, one or more signals within the search space; and
performing, using the PSRD demodulator, a demodulation of the one or more signals based on generating the LLRs by searching, based on the search space size, over the constellation corresponding to the search space.

18. The method of claim 17, further comprising transmitting, to the base station, one or more uplink signals for determining the search space size, wherein receiving the indication of the search space size is based on transmitting the one or more uplink signals.

19. The method of claim 18, wherein the one or more uplink signals include at least one of a channel state information (CSI) report of a received channel or a sounding reference signal (SRS).

20. The method of claim 17, wherein performing the demodulation of the one or more signals is based on a level of quadrature amplitude modulation that is correlated to the search space size.

21. The method of claim 17, further comprising determining the search space size including calculating the search space size based on one or more parameters of the indication of the search space size.

22. The method of claim 21, wherein calculating the search space size includes calculating the search space size as a power of two determined based on the one or more parameters.

23. The method of claim 17, wherein performing the demodulation of the one or more signals is based on a QR decomposition over a vector of estimated symbols from a received vector for the one or more signals.

24. The method of claim 17, wherein receiving the indication of the search space size includes receiving a downlink control information (DCI) from the base station that includes the indication of the search space size.

25. A method for wireless communication, comprising:
receiving, from a user equipment (UE), one or more uplink signals;
determining, based on the one or more uplink signals, a search space size of a search space for a per-stream recursive demapping (PSRD) demodulator of the UE to use in demodulating signals received via a transceiver at least in part by generating log likelihood ratios (LLRs) by searching over a constellation corresponding to the search space of the search space size; and
transmitting, to the UE, an indication of a search space size.

26. The method of claim 25, wherein the one or more uplink signals include at least one of a channel state information (CSI) report of a received channel or a sounding reference signal (SRS).

27. The method of claim 25, wherein the indication of the search space size includes one or more parameters for determining the search space size.

28. The method of claim 25, wherein the search space size corresponds to a level of quadrature amplitude modulation (QAM) for performing demodulation by the PSRD demodulator.

29. The method of claim 25, wherein determining the search space size is based on an artificial intelligence process based on a channel quality value determined from the one or more uplink signals.

30. The method of claim 25, wherein transmitting the indication of the search space size includes transmitting, to the UE, a downlink control information (DCI) that includes the indication of the search space size.

* * * * *